(12) United States Patent
Ikeno et al.

(10) Patent No.: US 6,304,118 B1
(45) Date of Patent: *Oct. 16, 2001

(54) SYNCHRONOUS CIRCUIT HAVING CIRCUIT FOR DETECTING PHASE ERROR AT CENTER OF REFERENCE SIGNAL

(75) Inventors: Tomokazu Ikeno; Hirofumi Sakurai, both of Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/192,920

(22) Filed: Nov. 16, 1998

(30) Foreign Application Priority Data

Nov. 19, 1997 (JP) .................................................. 9-318235

(51) Int. Cl.⁷ ........................................................ H03L 7/06
(52) U.S. Cl. ......................... 327/159; 327/150; 327/151; 327/160; 375/376; 331/DIG. 2; 365/233.5
(58) Field of Search ..................................... 327/141, 144, 327/146, 147, 150, 151, 155, 156, 159, 160; 375/371, 376, 327, 362; 331/17, 25, 40, DIG. 2, 1 A; 365/233, 233.5, 236

(56) References Cited

U.S. PATENT DOCUMENTS

| | | | | |
|---|---|---|---|---|
| 4,802,009 | * | 1/1989 | Hartmeier | 348/537 |
| 5,337,335 | * | 8/1994 | Cloetens et al. | 375/120 |
| 5,727,038 | * | 3/1998 | May et al. | 375/376 |

* cited by examiner

Primary Examiner—Timothy P. Callahan
Assistant Examiner—Minh Nguyen
(74) Attorney, Agent, or Firm—Ostrolenk, Faber, Gerb & Soffen, LLP

(57) ABSTRACT

In a synchronous circuit constructed with a sequence circuit, for reproduce a clock signal synchronized with a synchronizing signal of such as television signal, an influence of variation of a d.c. component superposed on an edge of the synchronizing signal is reduced by obtaining phase errors at a falling edge and a rising edge of the synchronizing signal, arithmetically operating the phase errors and feeding back a result of the operation of the phase errors to a PLL. An influence of pseudo synchronizing signal is restricted by updating a phase error signal or holding a previous value according to the result of count of operation clocks during the synchronizing signal period.

3 Claims, 5 Drawing Sheets

Tf: OSCILLATION PERIOD
Hinc': INCREMENT FOR EACH OPERATION CLOCK

SYNCHRONOUS CIRCUIT HAVING CIRCUIT FOR DETECTING PHASE ERROR AT CENTER OF REFERENCE SIGNAL

BACKGROUND OF THE INVENTION

1. Field of the Invention

The present invention relates to a synchronous circuit and more particularly a synchronous circuit having a circuit for detecting a phase error at a center of reference signal.

2. Description of Related Art

A conventional synchronous circuit is shown in FIG. 5 used to reproduce a clock signal of a television signal. As shown in FIG. 5, the conventional synchronous circuit comprises a phase error detector 1, a voltage controlled oscillator (VCO) 2 and a smoothing capacitor 3. The phase error detector 1 is constructed with a multiplier circuit supplied with. a horizontal synchronizing signal (referred to as "H-sync signal", hereinafter) synchronously separated from the television signal and an output signal of the VCO 2. The smoothing capacitor 3 smooths an output current of the phase error detector 1 and the VCO 2 oscillates at a frequency controlled by a phase error signal obtained by converting the output current of the phase error detector 1 into a voltage by the smoothing capacitor 3.

Describing an operation of the conventional synchronous circuit, a discharge current or a suction (charge) current flows on an output side of the phase error detector 1 depending upon the polarity of an output of the VCO 2 for only a time period in which the H-sync signal is in an active state. By smoothing this current by the smoothing capacitor 3, a potential difference proportional to a difference in phase between a center of the H-sync period and an edge of the output waveform of the VCO 2 is obtained as a control signal for the VCO 2.

When the edge of the output waveform of the VCO 2 is precedent to the center of the H-sync period, the suction charge becomes larger than the discharge charge on the output side of the phase error detector 1, so that the control voltage of the VCO 2 is reduced to thereby lower the oscillation frequency of the VCO 2 and hence delay the phase of the output waveform of the VCO 2.

On the contrary, when the edge of the output waveform of the VCO 2 is succeeding to the center of the H-sync signal period, the discharge current becomes larger than the suction current on the output side of the phase error detector 1, so that the control voltage of the VCO 2 is increased to thereby advance the phase of the output waveform of the VCO 2. In this manner, a phase locked loop (PLL) is formed, and the clock signal synchronized with the H-sync signal is obtained.

Now, an operation of the phase error detector will be described in detail with reference to FIG. 5 showing the circuit connection and FIG. 6 showing potentials and currents at respective points of the circuit.

When the H-sync of positive logic shown in FIG. 6 is input from a synchronizing signal separator circuit (not shown) to an REF terminal of the phase error detector 1 as shown in FIG. 5, a collector current I (ampere) of a transistor Q1 having a base connected to the REF terminal flows in only the H-sync period and the collector current is cut off in other period than the H-sync period.

When the output of the VCO 2 is in low state in the H-sync period, a current i1 flowing through a transistor Q2 becomes I amperes, otherwise, i1=0. Similarly, when the output of the VCO 2 is in high state in the H-sync period, a current i2 flowing through a transistor Q3 becomes I amperes, otherwise, i2=0.

That is, the output current $i_{out}$ of the phase error detector 1 becomes I amperes in the discharge direction only when the output of the VCO 2 is in low state within the H-sync period and becomes I amperes in the suction direction when the output of the VCO 2 is in high state within the H-sync period and there is no current flows in other period than the H-sync period.

When such output current $i_{out}$ of the phase error detector 1 is supplied to the capacitor 3, a charge/discharge curve thereof becomes as depicted by $V_{ctr1}$ shown in FIG. 6 and the potential difference $\Delta V$ proportional to the difference in phase between the edge of the output signal of the VCO 2 and the center of the H-sync period. The above can be represented by the following equation (1):

$$\Delta V = \{I \times t1 - I \times (T-t1)\}/C = \{2I \times t1 - I \times T\}/C$$

$$t2 = t1 - T/2$$

$$\therefore \Delta V = 2I/C \times t2 \qquad (1)$$

where $\Delta V$ ... change of the control signal $V_{ctr1}$ of the VCO 2

I ... collector current of the transistor Q1 in the H-sync period

T ... H-sync period t1 ... delay (phase difference) from a front edge of the H-sync period to a front edge of the output signal of the VCO 2 t2 ... phase delay (phase difference) from the center of the H-sync period to the front edge of the output signal of the VCO 2

C ... capacitance of the smoothing capacitor 3, and, from the operating condition of the phase error detector 1, t1<T, −T/2<t2<T/2.

The oscillation frequency of the VCO 2 is controlled by the control signal $V_{ctr1}$ and, when the center phase of the H-sync period is advanced to the front edge phase of the output signal of the VCO 2 (t2>0), $\Delta V$ becomes positive to increase the control signal $V_{ctr1}$ to thereby advance the front edge phase of the output signal of the VCO 2.

Therefore, in the normal state, t2≈0 second, that is, $\Delta V \approx 0$ volt, and the VCO 2 oscillates in synchronism with the H-sync signal.

However, since the phase error detector 1 shown in FIG. 5 obtains the phase error between the reference signal and the H-sync signal by using the analog multiplier circuit, the phase error signal is saturated and becomes 1 or 0 constantly for the phase error exceeding the period of the H-sync signal, although the error signal becomes proportional to the phase error when the phase error is within the period of the H-sync signal.

That is, the loop gain when the phase error exceeding the period of the H-sync signal is input becomes 0 and the synchronizing operation is not performed until the phase error becomes inside of the period of the H-sync signal. As a result, the response characteristics of the loop are degraded during a period from the asynchronized state after the power source is turned on to the time at which the phase is locked or during a period from a time at which the phase is unlocked for some external reason to a time at which the phase is locked again.

Further, since the smoothing circuit connected to the output side of the phase error detector 1 is realized by the resistance element and the capacitance element which are outside the integrated circuit, the temperature characteristics of the phase error detector 1 may be different from that of the smoothing circuit (smoothing capacitor 3) and the manufacturing variation of the phase error detector 1 is also different from that of the smoothing circuit, so that the temperature characteristics and the variation may be introduced to the PLL loop gain.

SUMMARY OF THE INVENTION

An object of the present invention is to provide a synchronous circuit constructed with a sequence circuit for reproducing a clock signal synchronized with a synchronizing signal of a television signal or video signal, in which an influence of variation of a d.c. component superposed on the synchronizing signal and an influence of a pseudo synchronizing signal are restricted.

In order to achieve the above mentioned object, the synchronous circuit according to the present invention includes a sequence circuit which is realized by a digital signal processing and detects an error in phase at a center of a reference signal by using a rising edge and a falling edge of the reference signal.

According to a first aspect of the present invention, the synchronous circuit includes a sequence circuit which is realized by a digital signal processing of a reference signal and detects a phase error at a center of the reference signal on the basis of two count values of a discrete time oscillator (DTO) at the rising edge of the reference signal and the falling edge of the reference signal.

The influence of variation of a d.c. component superposed on an edge of the synchronizing signal is reduced by obtaining phase errors at a rising edge and a falling edge of a synchronizing signal and feeding back a result of arithmetic operation of the phase errors at the rising and falling edges of the synchronizing signal to the phase locked loop (PLL).

Further, the influence of pseudo synchronizing signal is restricted by updating the phase error signal or holding a previous value of the phase error signal, according to a count value of operation clocks during the synchronizing signal period.

According to a second aspect of the present invention, the synchronous circuit utilizing a phase locked loop (PLL) realized by a digital signal processing comprises, a discrete time oscillator responsive to an output of a loop filter as a control input, a phase error detector responsive to a reference signal alternating between two levels about a first threshold value and an output data of the discrete time oscillator, and a loop filter responsive to the output data of the phase error detector.

The discrete time oscillator is constructed with a counter a count of which takes a round by neglecting a carry when it overflows.

The phase error detector detects the phase error signal on the basis of a first amount of phase error corresponding to a count value of the discrete time oscillator at first polarity points (edges) among rising and falling change points (edges) at which the reference signal crosses the first threshold value in one direction and a second amount of phase error corresponding to a count of the discrete time oscillator at second polarity points at which the reference signal crosses the first reference threshold in the opposite direction.

According to a third aspect of the present invention, the synchronous circuit is constructed with a sequence circuit driven at change points of the operation clock signal and is responsive to samples of a reference signal, wherein the phase error detector obtains a first difference between values of an edge of the reference signal of a first polarity at a first operation clock timing and a second operation clock timing on opposite sides of a first threshold value and a second difference between the value of the reference signal at the first operation clock timing and the first threshold value, divides the second difference by the first difference to obtain a first timing correction rate, multiplies the thus obtained first timing correction rate with an increase of a count value of the phase error detector in a period between the first operation clock timing to the second operation clock timing to obtain a first amount of timing correction, adds the first amount of timing correction to a first count value of the phase error detector at the first operation clock timing to estimate a second count value of the phase error detector at a timing at which the edge of the first polarity of the reference signal coincides with the first threshold value, similarly estimates a third count value of the phase error detector at a timing at which the edge of a second polarity of the reference signal coincides with the first threshold value and provides the second and third count values of the phase error detector as a first and second phase error amounts, respectively.

The synchronous circuit further comprises means for counting the operation clocks in a period from the edge of the first polarity of the reference signal to the edge of the second polarity thereof and updating the phase error signal output or switching to an arbitrary output, dependently upon the count value.

According to a third aspect of the present invention, the synchronous circuit includes a sequence circuit realized by a processing of digital signals and detects a phase error at a center of the reference signal on the basis of two count values of a discrete time oscillator (DTO) at the falling edge of the reference signal and the rising edge of the reference signal, wherein the influence of variation of a d.c. component superposed on an edge of the synchronizing signal is reduced by obtaining phase errors at both the rising edge and falling edge of the synchronizing signal (reference signal), arithmetically operating the phase errors at the two points and feeding back a result of the arithmetic operation of the phase errors at the two points of the synchronizing signal to the phase locked loop (PLL). Further, the influence of pseudo synchronizing signal is restricted by updating the phase error signal or holding the previous value according to the result of count of operation clocks during the synchronizing signal period.

BRIEF DESCRIPTION OF THE DRAWINGS

The above and other objects, features and advantages of the present invention will become more apparent by reference to the following detailed description of the invention taken in conjunction with the accompanying drawings, in which.

DETAILED DESCRIPTION OF THE PREFERRED EMBODIMENTS

[Embodiment 1]

Figure 1:
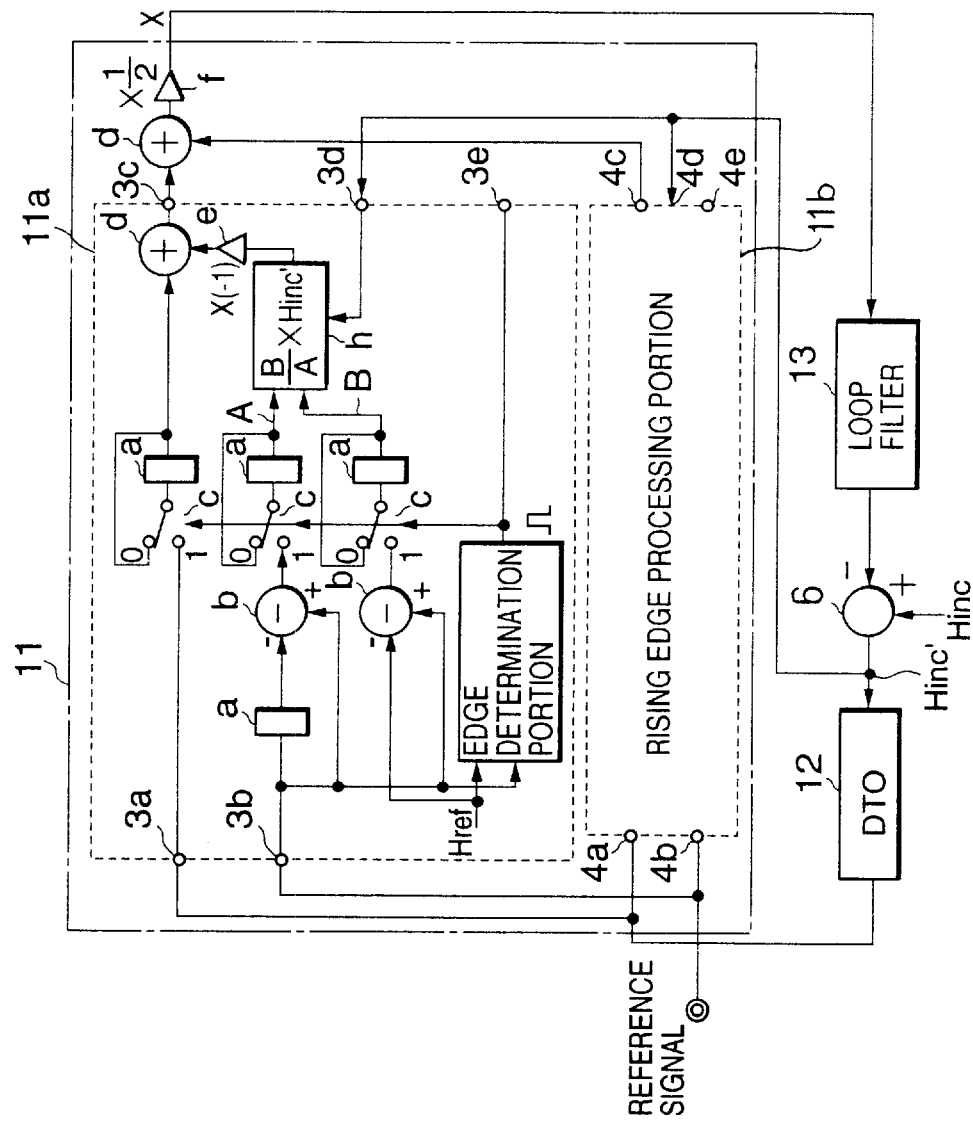
FIG. 1 is a block circuit diagram showing a first embodiment of the present invention.

FIG. 1 is a block circuit diagram showing a synchronous circuit according to a first embodiment of the present invention.

In FIG. 1, the synchronous circuit of the present invention is basically realized by a digital signal processing by a sequence circuit and detects a phase error at a center of the reference signal on the basis of two count values of a discrete time oscillator (DTO) at the rising edge of the reference signal and the falling edge of the reference signal. The synchronous circuit reduces the influence of variation of a d.c. component superposed on an edge of the synchronizing signal by obtaining phase errors at both the rising edge and falling edge of the synchronizing signal (reference signal), arithmetically operating the phase errors at the two points and feeding back a result of the arithmetic operation of the phase errors at the two points of the synchronizing signal to the phase locked loop. The influence of pseudo synchronizing signal is restricted by updating the phase error signal or holding the previous value according to the result of count of operation clocks during the synchronizing signal period.

As shown in FIG. 1, the synchronous circuit comprises a phase locked loop (PLL) as the sequence circuit which is realized by a digital signal processing to be performed by a discrete time oscillator (DTO) 12, a phase error detector 11 and a loop filter 13.

The DTO 12 performs a control operation according to an output signal from the loop filter 13.

The phase error detector 11 is supplied with a reference signal which has two values or levels with a first threshold value or level being intermediate therebetween, and the output signal from the DTO 12, arithmetically operates a first amount of phase error corresponding to a count value of the DTO 12 at a timing of an edge (change point) in a first polarity of the reference signal among rising and falling edges (change points), at which the reference signal crosses the first threshold value in one direction, and a second amount of phase error corresponding to a count value of the DTO 12 at a timing of an edge in a second polarity of the reference signal at which the reference signal crosses the first reference threshold in the opposite direction to obtain a phase error signal and outputs the phase error signal to the loop filter 13.

The output signal of the phase error detector 11 is regulated in gain and integrated by the loop filter 13 and supplied to the DTO 12 corresponding to the voltage controlled oscillator as the control signal. The output of the DTO 12 and the reference signal are supplied to the phase error detector 11.

The DTO 12 is a counter incremented by $H_{inc}'$ every operation clock and continues the counting from the minimum count cyclically without carry at a time of over-flow. Therefore, the count value of the DTO 12 becomes equivalent to one obtained by sampling a continuous saw tooth waveform. By changing the increment $H_{inc}'$, the tilting of the saw tooth waveform is changed and one period of the saw tooth waveform becomes an oscillation period thereof.

Figure 4:
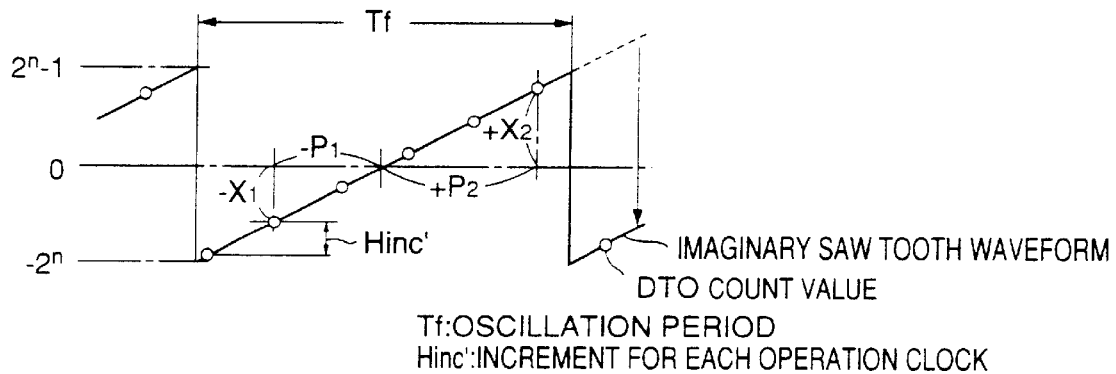
FIG. 4 shows an example of an output data of a discrete time oscillator.
Figure 5:
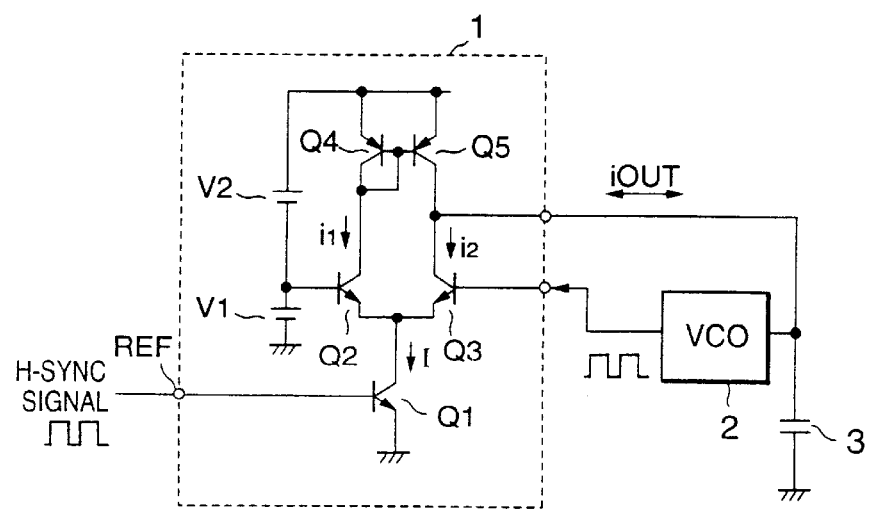
FIG. 5 is a circuit diagram of a conventional synchronous circuit.
Figure 6:
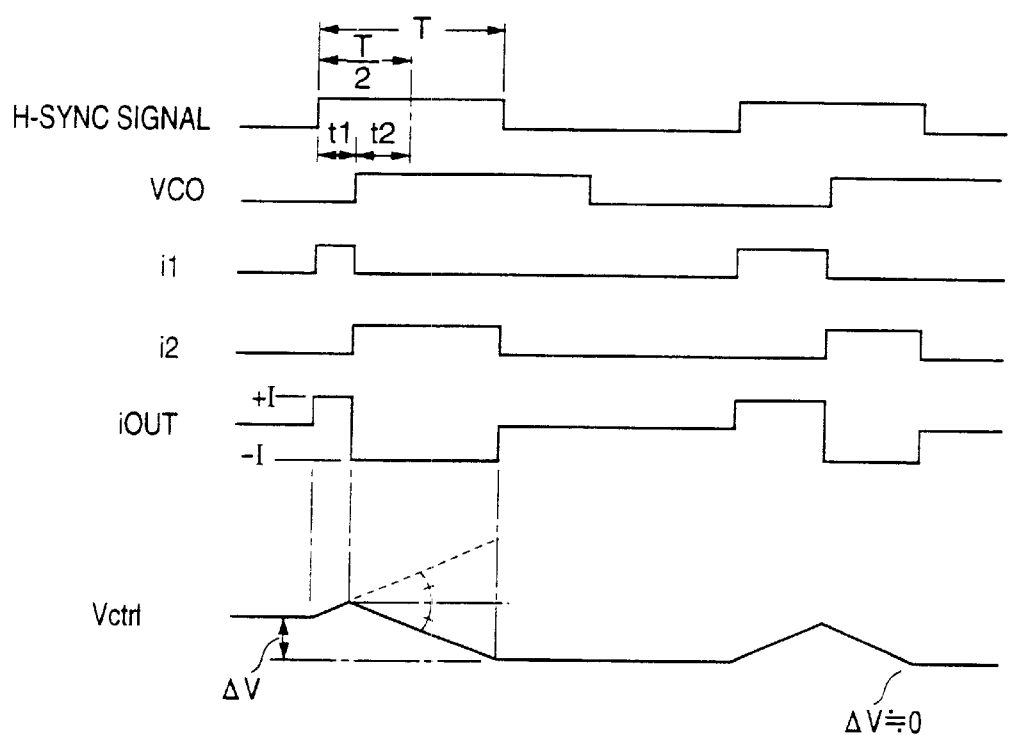
FIG. 6 shows signal waveforms for explaining an operation of the conventional synchronous circuit shown in FIG. 5.

When the DTO 12 is a (n+1)-bit counter, the count value of the counter corresponds to a range from $-2^n$ to $+2^n-1$ and the count value at the center of the tilting of the saw tooth waveform becomes 0. FIG. 4 shows the output data of the DTO 12.

The phase error detector 11 includes means for acquiring the count value of the DTO 12 in a reference phase of the reference signal and an output of the acquiring means is the phase error signal. Therefore, when the reference phase of the reference signal is advanced to the center phase in the DTO 12, that is, the timing at which the count value of the DTO 12 becomes 0, the reference phase is of a negative polarity and, when the reference phase of the reference signal is delayed from the center phase therein, that is, the timing at which the count value of the DTO 12 becomes 0, the reference phase is of a positive polarity, so that a phase error signal proportional to the phase difference is obtained. After this phase error signal is smoothed by the loop filter 13 of an FIR type or an IIR type and its gain is regulated, a subtracter 6 subtracts the phase error from the increment value of the DTO 12 as a correction value.

That is, when the center phase in the DTO 12 is advanced to the reference phase of the reference signal, the count value $H_{inc}$ is subtracted by a positive correction value, so that the tilt of the saw tooth waveform of the DTO 12 is reduced to lower the frequency of the saw tooth waveform, that is, to delay the phase of the saw tooth waveform of the DTO 12.

On the contrary, when the center phase of the DTO 12 is after the reference phase of the reference signal, the count value $H_{inc}$ is subtracted by a negative correction value, so that the tilt of the saw tooth waveform of the DTO 12 is increased to increase the frequency of the saw tooth waveform, that is, to advance the phase of the saw tooth waveform of the DTO 12.

Therefore, in the normal state, the center phase of the saw tooth waveform of the DTO 12 and the reference phase of the reference signal are substantially coincident.

Now, the phase error detector 11 will be described in detail with reference to FIG. 1 again.

As mentioned previously, the phase error detector 11 of the present invention includes a falling edge processing portion 11a and a rising edge processing portion 11b. Each of the falling edge processing portion 11a and the rising edge processing portion 11b includes D flip-flops a, operating as latches, which are operated in response to a rising edge or a falling edge of the operation clock timing, subtracters b, switches c, an adder d, a (−1) multiplier circuit e, an edge determination portion g and a divider h. Reference numerals 3a and 3b depict input terminals of the falling edge processing portion 11a, 3c, 3d and 3e output terminals of the falling edge processing portion 11a, 4a and 4b input terminals of the rising edge processing portion 11b and 4c, 4d and 4e output terminals of the falling edge processing portion 11b. The phase error detector 11 further includes an adder d and a (½) multiplier circuit f. The edge determination portion g of the falling edge processing portion 11a detects a falling edge of the reference signal and the edge determination portion g of the rising edge processing portion 11b detects a rising edge of the reference signal.

An operation of the phase error detector 11 will be described with reference to signal waveforms shown in FIG. 2.

Figure 2:
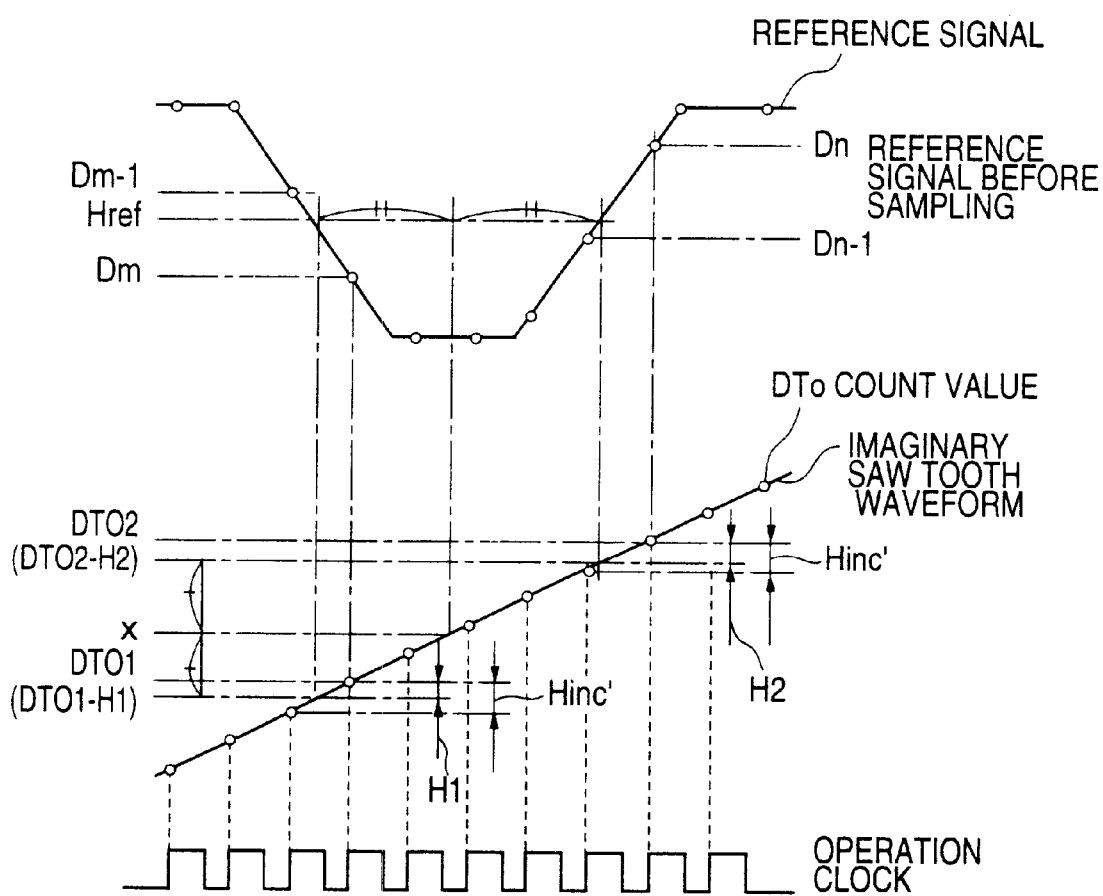
FIG. 2 shows signal waveforms for explaining an operation of the embodiment shown in FIG. 1.

First, the edge determination portion g of the falling edge processing portion 11a detects an edge of an edge determining threshold value $H_{ref}$ and a first difference between a value $D_m$ of the reference signal at the operation clock timing immediately after the falling edge of the reference signal exceeds the edge determining threshold value $H_{ref}$, that is, the rising edge of the operation clock shown by 0 in FIG. 2, and a value $D_{m-1}$ of the reference signal at the operation clock timing immediately before the falling edge of the reference signal exceeds the edge determining threshold value $H_{ref}$ is obtained (latched) by the flip-flops a and the subtracters b. Simultaneously therewith, a second difference between $D_m$ and $H_{ref}$ is obtained by the subtracter b. The divider h divides the second difference (B in FIG. 1) by the first difference (A in FIG. 1) to obtain a correction rate of the threshold value timing within the operation clock period.

The (−1) multiplier circuit e multiplies the correction rate with the increment $H_{inc}'$ of the count value of the DTO 12 for 1 operation clock to obtain a threshold value timing correction amount H1 converted to the count value of the DTO 12. The adder d adds a count value DTO1 of the DTO 12 at the operation clock timing immediately after the rising edge of the reference signal exceeds $H_{ref}$ to the correction amount H1 to obtain a count value (DTO1−H1) of the DTO 12 at a time when the falling edge of the reference signal crosses $H_{ref}$.

A similar processing is performed by the rising edge processing portion 11b to obtain a count value (DTO2−H2) of the DTO 12 at a time when the rising edge of the reference signal crosses $H_{ref}$.

A count value x of the DTO 12 in the center phase (reference phase) between the rising and falling edges of the reference signal is obtained by averaging the thus obtained count values of the DTO 12 by the adder d and the (½) multiplier circuit f and the count value x becomes the phase error signal to be supplied to the loop filter 13.

The above is represented by the following equation (2):

$$x=\{DTO1-H1+(DTO2-H2)\}/2$$

$$H1=H_{inc}'\times(D_m-H_{ref})/(D_m-D_{m-1})$$

$$H2=H_{inc}'\times(D_n-H_{ref})/(D_n-D_{n-1}) \qquad (2)$$

where x . . . the count value of the DTO 12 in the center phase between the rising and falling edges of the reference signal, DTO1 . . . the count value of the DTO 12 at a first operation clock timing after the falling edge of the reference signal becomes smaller than the threshold value, DTO2 . . . the count value of the DTO 12 at a first operation clock timing after the falling edge of the reference signal becomes larger than the threshold value, H1 . . . the correction amount of the falling edge position converted into the count value of the DTO 12, H2 . . . the correction amount of the rising edge position converted into the count value of the DTO 12, $H_{ref}$ . . . the edge determination threshold value of the reference signal, $H_{inc}'$ . . . the increment of the DTO 12, $D_m$ . . . the value of the reference signal at a timing of the DTO1, $D_{m-1}$ . . . the value of the reference signal at a timing immediately before the timing of the DTO1, $D_n$ . . . the value of the reference signal at a timing of the DTO2, $D_{n-1}$ . . . the value of the reference signal at a timing immediately before the timing of the DTO2.

[Embodiment 2]

Figure 3:
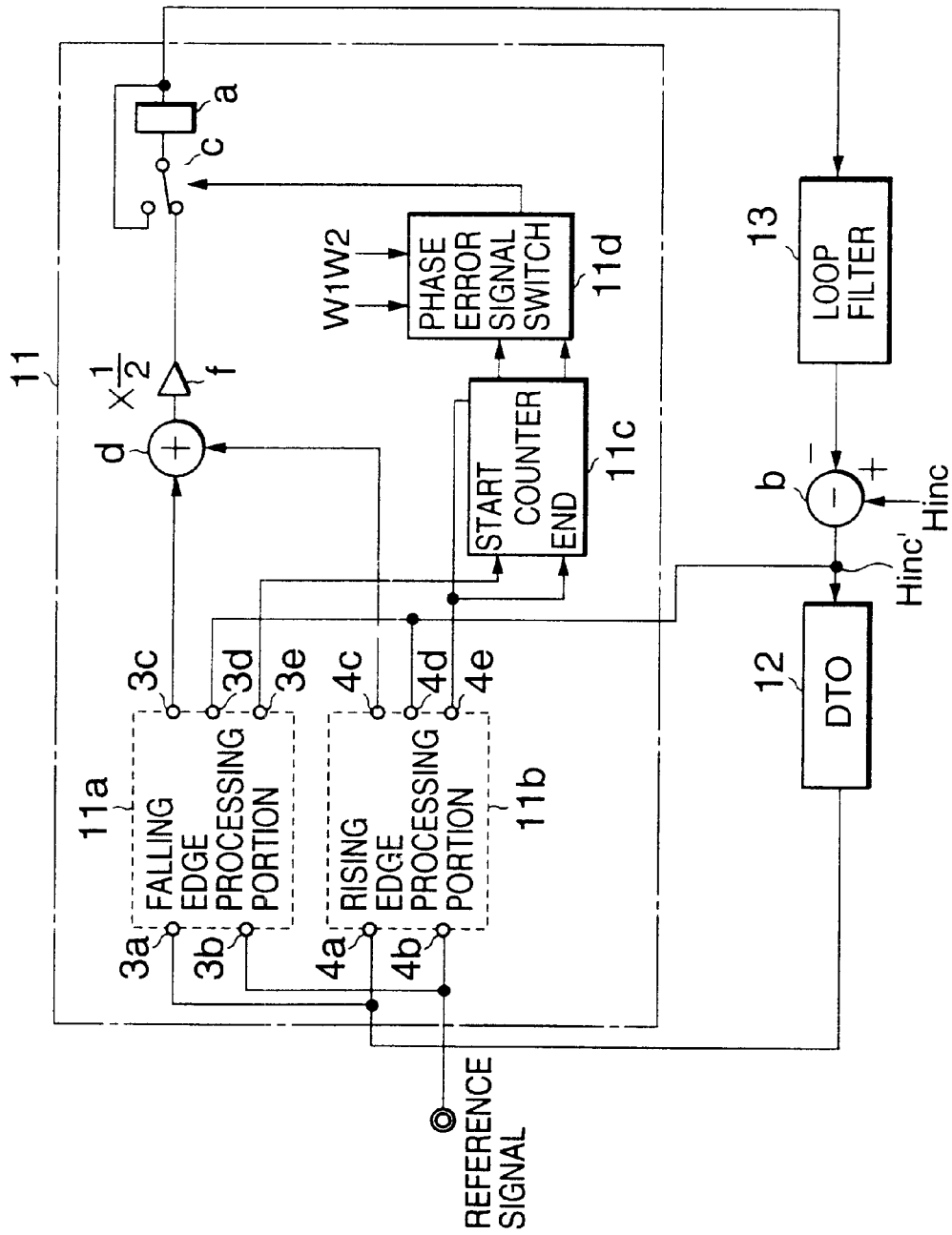
FIG. 3 is a block circuit diagram showing a second embodiment of the present invention.

FIG. 3 shows a construction of a synchronous circuit according to a second embodiment of the present invention.

The synchronous circuit shown in FIG. 3 includes means for counting the operation clocks during a period from an edge of a first polarity of the reference signal to an edge of a second polarity thereof and updating the phase error signal output or switching to an arbitrary output according to the counted value.

The synchronous circuit shown in FIG. 3 includes a phase error detector 11 which includes, in addition to the same components as those shown in FIG. 1, a counter 11c, a phase error signal switch 11d, a D flip-flop a and a switch c, a DTO 12, a subtracter b and a loop filter 13.

The counter 11c starts to count at an operation clock timing immediately after the falling edge of the reference signal exceeds the edge determination threshold value $H_{ref}$. The phase error signal switch 11d functions to allow the phase error output to be updated when the count value of the counter 11c at the rising edge of the reference signal is larger than a window data W1 and smaller than a window data W2, otherwise, to hold the current state.

According to the second embodiment of the present invention, it is possible to prevent an erroneous operation due to pseudo synchronizing signal such as noise, by setting the window data W1 and W2 suitably.

As described hereinbefore, since, according to the present invention, it is possible to output an error signal proportional to a phase error without saturation of the error signal output even for a phase error exceeding the horizontal synchronizing signal width, the loop gain is not changed even when a phase error exceeding the horizontal synchronizing signal width is input and it is possible to continuously perform the pull-in operation. As a result, it is possible to prevent the response characteristics from being degraded in a period from the asynchronous state after the power is turned on up to a time at which the phase is locked or, when a locked phase is unlocked due to some external disturbance, in a period from the unlocked time to a time at which the phase is locked again.

Further, it is possible to prevent an erroneous operation due to pseudo synchronizing signal by determining whether or not a synchronizing signal is a true synchronizing, by measuring the horizontal synchronizing signal width.

Further, it is possible to exclude variation of temperature characteristics in a clock reproducing circuit or variation of manufactured clock reproducing circuits by digitally processing signals and it is possible to reduce the influence of variation of the d.c. component superposed on the reference signal waveform, by performing the phase error detection for the center phase of the reference signal as in the conventional technique.

What is claimed is:

1. A synchronous circuit comprising:
  a discrete time oscillator receiving an increment value and outputting a count value, said discrete time oscillator being a counter incremented by said increment value in response to an operating clock signal;
  a phase error detector having:
    a first circuit latching a first difference value between a first value of a reference signal in response to an (n−1)-th operating clock signal and a second value of said reference signal in response to an n-th operating clock signal,
    a second circuit latching a second difference value between said second value of said reference signal in response said n-th operating clock signal and an edge determination threshold,
    an edge detector detecting an edge of said reference signal when a value of said reference signal passes said edge determination threshold value, and
    circuitry for calculating a correction rate based on a ratio of said first difference value and said second difference value; and outputting a phase error signal based on said correction rate and said count value; and a correction circuit varying said increment value based on said phase error signal.

2. A synchronous circuit comprising:

a discrete time oscillator receiving an increment value and outputting a count value, said discrete time oscillator said being a counter incremented by said increment value in response to an operating clock;

a first arithmetic operator calculating a first difference value between a first value of a reference signal of an (n−1)-th timing and a second value of said reference signal of an n-th timing following said (n−1)-th timing when a value of said reference signal is through an edge determination threshold value from said (n−1)-th timing to said n-th timing, and said first arithmetic operator outputting said first difference value;

a second arithmetic operator calculating a second difference value between said second value and said edge determination threshold value, and said second calculator arithmetic operator outputting said second difference value;

a third arithmetic operator calculating a correction rate based on a ratio of said second difference value and said first difference value, and said third arithmetic operator calculating a correction value based on said correction rate and said increment value;

a fourth arithmetic operator calculating a corrected value based on said count value and said correction value, and said fourth arithmetic operator outputting said corrected value; and a correction circuit varying said increment value based on said corrected value.

3. A synchronous circuit comprising:

a discrete time oscillator receiving an increment value and outputting a count value, said discrete time oscillator being a counter incremented by said increment value in response to an operating clock;

a first arithmetic operator calculating a first difference value between a first value of a reference signal of an (n−1)-th timing and a second value of said reference signal of an n-th timing following said (n−1)-th timing when a value of a falling edge of said reference signal is through an edge determination threshold value from said (n−1)-th timing to said n-th timing, and said first arithmetic operator outputting said first difference value;

a second arithmetic operator calculating a second difference value between said second value and said edge determination threshold value, and said second arithmetic operator outputting said second difference value;

a third arithmetic operator calculating a first correction rate based on a ratio of said second difference value and said first difference value, and said third arithmetic operator calculating a first correction value based on said first correction rate and said increment value;

a fourth arithmetic operator calculating a first corrected value based on said count value and said first correction value, and said fourth arithmetic operator outputting said first corrected value;

a fifth arithmetic operator calculating a third difference value between a third value of said reference signal of an (m−1)-th timing and a fourth value of said reference signal of said m-th timing when a value of a rising edge of said reference signal is through said edge determination threshold value from said (m−1)-th timing to said m-th timing, following said (m−1)-th timing, and said fifth arithmetic operator outputting said third difference value;

a sixth arithmetic operator calculating a fourth difference value between said fourth value and said edge determination threshold value, and said sixth arithmetic operator outputting said fourth difference value;

a seventh arithmetic operator calculating a second correction rate based on a ratio of said fourth difference value and said third difference value, and said seventh arithmetic operator calculating a second correction value based on said second correction rate and said increment value;

an eighth arithmetic operator calculating a second corrected value based on said count value and said second correction value, and said eighth arithmetic operator outputting said second corrected value; and a correction circuit varying said increment value based on said first corrected value and/or said second corrected value.

* * * * *